(12) United States Patent
Dai et al.

(10) Patent No.: US 12,416,863 B2
(45) Date of Patent: Sep. 16, 2025

(54) DRY DEVELOP PROCESS OF PHOTORESIST

(71) Applicant: Applied Materials, Inc., Santa Clara, CA (US)

(72) Inventors: Yuqiong Dai, Santa Clara, CA (US); Madhur Sachan, Belmont, CA (US); Regina Freed, Los Altos, CA (US); Hoyung David Hwang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/349,534

(22) Filed: Jun. 16, 2021

(65) Prior Publication Data
US 2022/0004105 A1    Jan. 6, 2022

Related U.S. Application Data

(60) Provisional application No. 63/047,160, filed on Jul. 1, 2020.

(51) Int. Cl.
*G03F 7/40* (2006.01)
*C23C 16/06* (2006.01)
(Continued)

(52) U.S. Cl.
CPC ............ *G03F 7/40* (2013.01); *C23C 16/06* (2013.01); *G03F 7/0047* (2013.01); *G03F 7/162* (2013.01); *G03F 7/20* (2013.01)

(58) Field of Classification Search
CPC .......... G03F 7/40; G03F 7/0047; G03F 7/162; G03F 7/20; G03F 7/0042; G03F 7/0043; G03F 7/36; C23C 16/06
See application file for complete search history.

(56) References Cited

U.S. PATENT DOCUMENTS 3,837,944 A    9/1974    Cole, Jr.
4,283,482 A    8/1981    Hattori et al.
(Continued)

FOREIGN PATENT DOCUMENTS

CN    108351594 A    7/2018
EP    0090615 A2    10/1983
(Continued)

OTHER PUBLICATIONS

Krysak, Marie, et al. "Development of an inorganic nanoparticle photoresist for EUV, e-beam, and 193nm lithography." In Advances in Resist Materials and Processing Technology XXVIII (vol. 7972, pp. 408-413). SPIE, 2011. (Year: 2011).*
(Continued)

*Primary Examiner* — Mark F. Huff
*Assistant Examiner* — Moriah S. Smoot
(74) *Attorney, Agent, or Firm* — Schwabe, Williamson & Wyatt, P.C.

(57) ABSTRACT

Embodiments disclosed herein include a method of developing a metal oxo photoresist with a non-wet process. In an embodiment, the method comprises providing a substrate with the metal oxo photoresist into a chamber. In an embodiment, the metal oxo photoresist comprises exposed regions and unexposed regions, and the unexposed regions comprise a higher carbon concentration than the exposed regions. In an embodiment, the method further comprises flowing a gas into the chamber, wherein the gas reacts with the unexposed regions to produce a volatile byproduct.

17 Claims, 5 Drawing Sheets

(51) Int. Cl.
  *G03F 7/004* (2006.01)
  *G03F 7/16* (2006.01)
  *G03F 7/20* (2006.01)

(56) References Cited

U.S. PATENT DOCUMENTS

| | | | |
|---|---|---|---|
| 4,292,384 | A | 9/1981 | Straughan et al. |
| 4,320,191 | A | 3/1982 | Yoshikawa et al. |
| 4,332,879 | A | 6/1982 | Pastor et al. |
| 4,464,455 | A | 8/1984 | Yoneda et al. |
| 4,560,641 | A | 12/1985 | Kokaku et al. |
| 4,842,989 | A | 6/1989 | Taniguchi et al. |
| 5,310,624 | A | 5/1994 | Ehrlich |
| 5,366,852 | A | 11/1994 | Pavelchek et al. |
| 5,439,780 | A | 8/1995 | Joshi et al. |
| 5,457,005 | A * | 10/1995 | Babich ............... G03F 7/0755 430/296 |
| 5,763,016 | A | 6/1998 | Levenson et al. |
| 5,885,751 | A | 3/1999 | Weidman et al. |
| 6,204,168 | B1 | 3/2001 | Naik et al. |
| 6,589,715 | B2 | 7/2003 | Joubert et al. |
| 6,825,562 | B2 | 11/2004 | Naik et al. |
| 6,855,485 | B2 | 2/2005 | Irie |
| 6,989,227 | B2 | 1/2006 | Weldman et al. |
| 7,064,076 | B2 | 6/2006 | Kulkarni |
| 7,713,678 | B2 | 5/2010 | Hosoda |
| 7,771,895 | B2 | 8/2010 | Wu et al. |
| 8,465,903 | B2 | 6/2013 | Weidman et al. |
| 8,536,068 | B2 | 9/2013 | Weidman et al. |
| 8,709,706 | B2 | 4/2014 | Wu et al. |
| 8,940,386 | B2 | 1/2015 | Ohtani et al. |
| 9,229,326 | B2 * | 1/2016 | Lu ....................... H01L 21/0332 |
| 9,310,684 | B2 | 4/2016 | Meyers et al. |
| 9,354,508 | B2 | 5/2016 | Beasley et al. |
| 9,411,237 | B2 | 8/2016 | Xie et al. |
| 9,417,515 | B2 | 8/2016 | Barman et al. |
| 9,470,980 | B2 | 10/2016 | Inoue et al. |
| 9,632,411 | B2 | 4/2017 | Michaelson et al. |
| 9,778,561 | B2 | 10/2017 | Marks et al. |
| 9,829,805 | B2 | 11/2017 | Michaelson et al. |
| 9,996,004 | B2 | 6/2018 | Smith et al. |
| 10,228,618 | B2 | 3/2019 | Meyers et al. |
| 10,642,153 | B2 | 5/2020 | Meyers et al. |
| 10,658,180 | B1 | 5/2020 | Mignot et al. |
| 10,787,466 | B2 | 9/2020 | Edson et al. |
| 10,831,096 | B2 | 11/2020 | Marks et al. |
| 11,599,022 | B2 | 3/2023 | Stowers et al. |
| 11,621,172 | B2 | 4/2023 | Kalutarage et al. |
| 2001/0008227 | A1 * | 7/2001 | Sadamoto ......... H01L 21/32136 216/75 |
| 2001/0009154 | A1 | 7/2001 | Nguyen et al. |
| 2004/0091618 | A1 | 5/2004 | Park et al. |
| 2004/0214113 | A1 | 10/2004 | Goldstein et al. |
| 2008/0014533 | A1 | 1/2008 | Keller et al. |
| 2011/0294072 | A1 * | 12/2011 | Park ................... H01L 21/0273 430/323 |
| 2012/0088193 | A1 | 4/2012 | Weidman et al. |
| 2012/0322015 | A1 | 12/2012 | Kim |
| 2014/0263172 | A1 | 9/2014 | Xie et al. |
| 2014/0356770 | A1 | 12/2014 | Hayashi |
| 2015/0056542 | A1 * | 2/2015 | Meyers ................ G03F 7/2002 430/296 |
| 2015/0200091 | A1 * | 7/2015 | Chada ............... H01L 21/31133 438/694 |
| 2015/0270140 | A1 | 9/2015 | Gupta et al. |
| 2016/0011502 | A1 | 1/2016 | Hofmann et al. |
| 2016/0116839 | A1 | 4/2016 | Meyers et al. |
| 2016/0329222 | A1 | 11/2016 | Xie et al. |
| 2016/0379833 | A1 | 12/2016 | Hong et al. |
| 2017/0146909 | A1 * | 5/2017 | Smith ................... G03F 7/2004 |
| 2017/0186614 | A1 | 6/2017 | Ko et al. |
| 2017/0261850 | A1 * | 9/2017 | Stowers ............. H01L 21/0338 |
| 2017/0271152 | A1 | 9/2017 | Char et al. |
| 2018/0138054 | A1 | 5/2018 | Romero et al. |
| 2018/0173096 | A1 | 6/2018 | Zi et al. |
| 2018/0307137 | A1 | 10/2018 | Meyers et al. |
| 2019/0131130 | A1 | 5/2019 | Smith et al. |
| 2019/0153001 | A1 | 5/2019 | Cardineau et al. |
| 2019/0198325 | A1 | 6/2019 | Briggs et al. |
| 2019/0308998 | A1 | 10/2019 | Cardineau et al. |
| 2019/0315781 | A1 | 10/2019 | Edson et al. |
| 2019/0337969 | A1 | 11/2019 | Odedra et al. |
| 2019/0384171 | A1 | 12/2019 | Zi et al. |
| 2020/0051807 | A1 | 2/2020 | Singhal et al. |
| 2020/0064733 | A1 | 2/2020 | Meyers et al. |
| 2020/0073238 | A1 | 3/2020 | Zi et al. |
| 2020/0176246 | A1 | 6/2020 | Huotari et al. |
| 2020/0223877 | A1 | 7/2020 | Odedra et al. |
| 2020/0239498 | A1 | 7/2020 | Clark et al. |
| 2020/0241413 | A1 | 7/2020 | Clark et al. |
| 2020/0326627 | A1 | 10/2020 | Jiang et al. |
| 2021/0305028 | A1 | 9/2021 | Guo et al. |
| 2022/0020584 | A1 | 1/2022 | Volosskiy et al. |
| 2022/0004105 | A1 | 2/2022 | Dai et al. |
| 2022/0244645 | A1 | 8/2022 | Tan et al. |
| 2022/0306657 | A1 | 9/2022 | Fabulyak et al. |
| 2022/0308447 | A1 | 9/2022 | Stowers et al. |
| 2022/0344136 | A1 * | 10/2022 | Peter ..................... G03F 7/167 |
| 2023/0019943 | A1 | 1/2023 | Nakabayashi et al. |
| 2023/0078946 | A1 | 3/2023 | Grzeskowiak et al. |
| 2023/0091094 | A1 | 3/2023 | Huotari et al. |
| 2023/0100995 | A1 | 3/2023 | Cardineau et al. |
| 2023/0143629 | A1 | 5/2023 | Clark |
| 2023/0152705 | A1 | 5/2023 | Grzeskowiak et al. |
| 2023/0197505 | A1 | 6/2023 | Lutker-Lee et al. |
| 2023/0215736 | A1 | 7/2023 | Kalutarage et al. |
| 2023/0290646 | A1 | 9/2023 | Kalutarage et al. |

FOREIGN PATENT DOCUMENTS

| | | | |
|---|---|---|---|
| EP | 0100079 A2 | 2/1984 | |
| EP | 1033744 A2 | 9/2000 | |
| EP | 2926199 B1 | 9/2020 | |
| JP | 05100425 A * | 4/1993 | ........... G03F 7/0755 |
| JP | 08320574 A | 12/1996 | |
| JP | 2014209622 A | 11/2014 | |
| JP | 2017116923 A | 6/2017 | |
| JP | 2019500490 A | 1/2019 | |
| JP | 2020510994 A * | 4/2020 | ....... H01L 21/02175 |
| JP | 2022538040 A | 8/2022 | |
| JP | 2022538554 A | 9/2022 | |
| KR | 1020220025020 | 3/2022 | |
| KR | 1020220025885 | 3/2022 | |
| KR | 1020237003446 | 3/2023 | |
| TW | 201443271 A | 11/2014 | |
| TW | 201601444 A | 1/2016 | |
| TW | 201635334 A | 10/2016 | |
| TW | 201841258 A | 11/2018 | |
| TW | 201842573 A | 12/2018 | |
| TW | 2020/06168 | 2/2020 | |
| TW | 202006168 A | 2/2020 | |
| TW | 202016279 A | 5/2020 | |
| TW | 202117468 A | 5/2021 | |
| TW | 202205013 A | 2/2022 | |
| TW | 202219632 A | 5/2022 | |
| WO | WO 2004-095551 | 11/2004 | |
| WO | WO 2018-004646 | 1/2018 | |
| WO | 2019217749 A1 | 11/2019 | |
| WO | 2020081483 A1 | 4/2020 | |
| WO | WO 2020-132281 | 6/2020 | |
| WO | WO-2020132281 A1 * | 6/2020 | ............. G03F 7/162 |
| WO | 2020264571 A1 | 12/2020 | |
| WO | WO 2020-264158 | 12/2020 | |
| WO | WO 2020-264557 | 12/2020 | |
| WO | WO-2020264158 A1 * | 12/2020 | ........... G03F 7/0042 |
| WO | WO 2021-072042 | 4/2021 | |
| WO | WO 2021-146138 | 7/2021 | |
| WO | 2021158433 A1 | 8/2021 | |
| WO | WO 2021-202146 | 10/2021 | |
| WO | WO-2022016127 A1 * | 1/2022 | ........... G03F 7/0043 |
| WO | 2022103764 A1 | 5/2022 | |
| WO | 2022125388 A1 | 6/2022 | |

(56) References Cited

FOREIGN PATENT DOCUMENTS

| | | |
|---|---|---|
| WO | 2022265874 A1 | 12/2022 |
| WO | 2023/009364 A1 | 2/2023 |
| WO | 2023089946 A1 | 5/2023 |

OTHER PUBLICATIONS

Cardineau, Brian, et al. "EUV resists based on tin-oxo clusters." In Advances in Patterning Materials and Processes XXXI (vol. 9051, pp. 335-346). SPIE, 2014. (Year: 2014).*
Buitrago, Elizabeth, et al. "SnOx high-efficiency EUV interference lithography gratings towards the ultimate resolution in photolithography." Microelectronic Engineering 155 (2016): 44-49. (Year: 2016).*
Honewell, "List of Reactive Gases." (2019) (Year: 2019).*
Niibe, Masahito, and Keigo Koida. "Competitive reactions of carbon deposition and oxidation on the surface of Mo/Si multilayer mirrors by EUV irradiation." Damage to VUV, EUV, and X-Ray Optics II. vol. 7361. SPIE. (Year: 2009).*
Preliminary Report on Patentability for Patent Application No. PCT/US2021/038758 dated Jan. 12, 2023, 6 pgs.
International Search Report and Written Opinion from International Patent Application No. PCT/US2021/038758 dated Oct. 15, 2021, 10 pgs.
Official Letter from Taiwan Patent Application No. 110123956 dated Jun. 2, 2023, 12 pgs.
Floy Chang, et al., "Gas-phase Silicon micromachining with xenon difluoride", Proceedings of SPIE, Downloaded from: https://www.spiedigitallibrary.org/conference-proceedings-of-spie. Jul. 13, 2023, pp. 117-128.
Shigeyasu Mori, et al., "Prediction of Resolution using wet-develop type single layer and dry-development process for EUV lithography", Microelectronic Engineering 53 (2000), pp. 689-692.
Gediminas Seniutinas, "Development of high-resolution 3D nano-technology tools: sensors focus", Faculty of Science, Engineering and Technology, Swinburne University of Technology, 2016, pp. 1-82, 91-123, 129-187, 213-261.
Hiroshi Ito, et al. "Chemical Amplification in the Design of Dry Developing Resist Materials", Polymer Engineering and Science, Dec. 1983, vol. 23, No. 18, pp. 1012-1018.
Theodore Manouras, et al. "High Sensitivity Resists for EUV Lithography: A Review of Material Design Strategies and Performance Results". nanomaterials Aug. 14, 2020, pp. 1-24.
Jason K. Stowers, "Direct Patterning of Solution Deposited Metal Oxides", Aug. 14, 2008, pp. 1-149.
T.W. Weidman, et al. "Applications of Plasma Polymerized Methylsilane as a Resist and Silicon Dioxide Precursor for 193 and 248 nm Lithography", SPIE vol. 2438. Jun. 9, 1995, pp. 496-503.
Matthew L. Wagner, et al. "The Use of HBr in Polysilicon Etching", Gases & Instrumentation International, vol. 7, Issue 4, Jul./Aug. 2013, pp. 1-7.
Notice of Reasons for Rejection from Japanese Patent Application No. 2022-580826 dated Feb. 26, 2024, 8 pgs.
Official Action from Taiwan Patent Application No. 112128099 dated Mar. 22, 2024, 5 pgs.
Official Action from Taiwan Patent Application No. 110123956 dated Apr. 16, 2024, 12 pgs.
International Search Report and Written Opinion from PCT/US2023/032497 dated Jan. 3, 2024, 9 pgs.
Official Letter from Taiwan Patent Application No. 112128099 dated Dec. 22, 2023, 6 pgs.
Notice of Reasons for Rejection from Japanese Patent Application No. 2022-580825 dated Jan. 23, 2024, 8 pgs.
Official Letter from Taiwan Patent Application No. 112128099 dated Sep. 22, 2023, 6 pgs.
Official Letter from Taiwan Patent Application No. 110124241 dated Mar. 28, 2023, 10 pgs.
International Search Report and Written Opinion from PCT/US2021/038424 dated Oct. 14, 2021, 9 pgs.
Non-Final Office Action from U.S. Appl. No. 18/198,743 dated Dec. 5, 2023, 28 pgs.
Non-Final Office Action from U.S. Appl. No. 17/348,589 dated Jul. 28, 2022, 11 pgs.
International Preliminary Report on Patentability from PCT/US2021/038424 dated Jan. 12, 2023, 6 pgs.
Non-Final Office Action from U.S. Appl. No. 18/116,556 dated Aug. 1, 2023, 9 pgs.
Non-Final Office Action from U.S. Appl. No. 18/116,556 dated Dec. 5, 2023, 25 pgs.
Final Office Action from U.S. Appl. No. 18/198,743 dated Mar. 6, 2024, 20 pgs.
International Search Report and Written Opinion from PCT/US2024/012192 dated May 13, 2024, 10 pgs.
Notice to File a Response from Korean Patent Application No. 10-2023-7003446 dated Jun. 19, 2024, 6 pgs.
International Search Report and Written Opinion from PCT/US2024/032380 dated Sep. 13, 2024, 7 pgs.
Notice to File a Response from Korean Patent Application No. 10-2023-7025985 dated Jul. 8, 2024, 12 pgs.
Preliminary Rejection from Korean Patent Application No. 10-2023-7003603 dated Jun. 26, 2024, 12 pgs.
Notice of Reasons for Rejection from Japanese Patent Application No. 2023-118745 dated Jul. 6, 2024, 8 pgs.
International Preliminary Report on Patentability from PCT/US2023/032497 dated May 22, 2025, 6 pgs.
Official Letter from Taiwan Patent Application No. 113149091 dated Jun. 23, 2025, 12 pgs.
Official Letter from Taiwan Patent Application No. 112134987 dated Jun. 12, 2025, 17 pgs.

* cited by examiner

DRY DEVELOP PROCESS OF PHOTORESIST

CROSS-REFERENCE TO RELATED APPLICATIONS

This application claims the benefit of U.S. Provisional Application No. 63/047,160, filed on Jul. 1, 2020, the entire contents of which are hereby incorporated by reference herein.

BACKGROUND

1) Field

Embodiments of the present disclosure pertain to the field of semiconductor processing and, in particular, to methods of patterning a metal oxo photoresist using a non-wet process.

2) Description of Related Art

Lithography has been used in the semiconductor industry for decades for creating 2D and 3D patterns in microelectronic devices. The lithography process involves spin-on deposition of a film (photoresist), irradiation of the film with a selected pattern by an energy source (exposure), and removal (etch) of exposed (positive tone) or non-exposed (negative tone) region of the film by dissolving in a solvent. A bake will be carried out to drive off remaining solvent.

The photoresist should be a radiation sensitive material and upon irradiation a chemical transformation occurs in the exposed part of the film which enables a change in solubility between exposed and non-exposed regions. Using this solubility change, either exposed or non-exposed regions of the photoresist is removed (developed). As used herein, "develop" refers to a process of forming a pattern into the photoresist. Now the photoresist is developed and the pattern can be transferred to the underlying thin film or substrate by etching. After the pattern is transferred, the residual photoresist is removed and repeating this process many times can give 2D and 3D structures to be used in microelectronic devices.

Several properties are important in lithography processes. Such important properties include sensitivity, resolution, lower line-edge roughness (LER), etch resistance, and ability to form thinner layers. When the sensitivity is higher, the energy required to change the solubility of the as-deposited film is lower. This enables higher efficiency in the lithographic process. Resolution and LER determine how narrow features can be achieved by the lithographic process. Higher etch resistant materials are required for pattern transferring to form deep structures. Higher etch resistant materials also enable thinner films. Thinner films increase the efficiency of the lithographic process.

SUMMARY

Embodiments disclosed herein include a method of developing a metal oxo photoresist with a non-wet process. In an embodiment, the method comprises providing a substrate with the metal oxo photoresist into a chamber. In an embodiment, the metal oxo photoresist comprises exposed regions and unexposed regions, and the unexposed regions comprise a higher carbon concentration than the exposed regions. In an embodiment, the method further comprises flowing a gas into the chamber, wherein the gas reacts with the unexposed regions to produce a volatile byproduct.

Embodiments may also include a method of developing a metal oxo photoresist that comprises providing a substrate with the metal oxo photoresist on a surface of the substrate, and exposing the metal oxo photoresist to form exposed regions and unexposed regions. In an embodiment, the unexposed regions comprise a higher carbon concentration than the exposed regions. In an embodiment, the method may further comprise placing the substrate in a plasma chamber, flowing a gas into the plasma chamber, and striking a plasma in the plasma chamber. In an embodiment, the plasma reacts with the unexposed regions to produce a volatile byproduct. In an embodiment, the method may further comprise purging the plasma chamber.

Embodiments may also include a method of developing a metal oxo photoresist that comprises providing a substrate with the metal oxo photoresist into a plasma chamber, where the metal oxo photoresist comprises SnOC. In an embodiment, the metal oxo photoresist comprises exposed regions and unexposed regions, and the unexposed regions comprise a higher carbon concentration than the exposed regions. In an embodiment, the method further comprises flowing a gas into the plasma chamber, where the gas comprises $Cl_2$ and Ar, and striking a plasma in the plasma chamber. In an embodiment, the plasma reacts with the unexposed regions to produce a volatile byproduct. The method may further comprise purging the plasma chamber.

DETAILED DESCRIPTION

Methods of patterning a metal oxo photoresist using non-wet processes are described herein. In the following description, numerous specific details are set forth, such as reactive plasma processes and material regimes for developing photoresist, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

To provide context, photoresist systems used in extreme ultraviolet (EUV) lithography suffer from low efficiency. That is, existing photoresist material systems for EUV lithography require high dosages in order to provide the needed solubility switch that allows for developing the photoresist material. Organic-inorganic hybrid materials (e.g., metal oxo materials systems) have been proposed as a material system for EUV lithography due to the increased sensitivity to EUV radiation. Such material systems typically comprise a metal (e.g., Sn, Hf, Zr, etc.), oxygen, and carbon. In some instances, the metal oxo material system may further comprise nitrogen and hydrogen. Metal oxo based organic-inorganic hybrid materials have also been shown to provide lower LER and higher resolution, which are required characteristics for forming narrow features.

In a metal oxo photoresist system, exposure to EUV radiation results in the removal of carbon and the cross-linking of the metal oxide network. The difference in the carbon percentage and bonding strength between the exposed regions and the unexposed regions is used as the solubility switch during developing. Particularly, the unexposed regions with the higher carbon content and weaker bond strength are preferentially etched by the developer solution.

Metal oxo photoresist systems are currently developed using a wet chemistry. That is, after exposure, the unexposed regions of the photoresist are developed by organic solvents/base solution that is used with a spin-dry process. A post-bake anneal may also be included. However, wet methods can be troublesome when dealing with high aspect ratio features due to the risk of pattern collapse (especially in line or pillar structures). Additionally, wet processes might not remove all of the material that is supposed to be removed and film materials/byproducts/solvents and the like may be trapped in small features since a mechanical force is used to remove the solvent and dissolved byproducts. Furthermore, with smaller and more complicated features, it is harder for the solvent (which is usually a larger molecule) to penetrate all areas of the unexposed resist. This leads to a partial develop of the photoresist and causes defects. The spin-dry process may also result in line wiggling and even falling off. This limits the photoresist thickness and aspect ratio.

Accordingly, embodiments of the present disclosure provide a plasma etching process to develop metal oxo photoresists. Particularly, plasma etching processes provide the advantages of: 1) eliminating the generation of wet byproducts; 2) lower waste streams due to dry chemistry being processed through an abatement system; 3) providing fewer defects and impurities; 4) improvement of LER, LWR, and any low frequency roughness originating from surface tension, capillary forces, and spin-dry processes; 5) providing an all-in-one-process for developing a photoresist and transferring the pattern into the underlayer; and 6) providing a high etch selectivity of the unexposed regions to the exposed regions of the metal oxo photoresist.

Embodiments disclosed herein provide a plasma etching process that is executed after portions of a metal oxo photoresist are exposed with a suitable electromagnetic radiation source (e.g., an EUV source). In an embodiment, a substrate comprising an exposed metal oxo photoresist is placed in a plasma chamber. A gas comprising a reactive gas and an inert gas is flown into the plasma chamber, and a plasma is struck. The reactive gas is a gas with constituents that react with the metal of the metal oxo photoresist to form a volatile species. For example, the reactive gas comprises one or more of $Cl_2$, $H_2$, $Br_2$, HBr, HCl, $BCl_3$, $CH_xCl_y$, $CH_4$, $BBr_3$, and $CH_xBr_y$. In a particular embodiment, the reactive gas comprises HBr and the inert gas comprises Ar. In some embodiments, the gas is flown into a chamber without striking a plasma (i.e., a thermal process). In other embodiments, a plasma may be struck. In an embodiment, an etch selectivity of the unexposed metal oxo photoresist to the exposed metal oxo photoresist may be 10:1 or greater. In a particular embodiment, the etch selectivity is approximately 12:1. In an embodiment, the pattern of the developed metal oxo photoresist may be transferred into the underlayer without removing the substrate from the plasma chamber.

Figure 1:
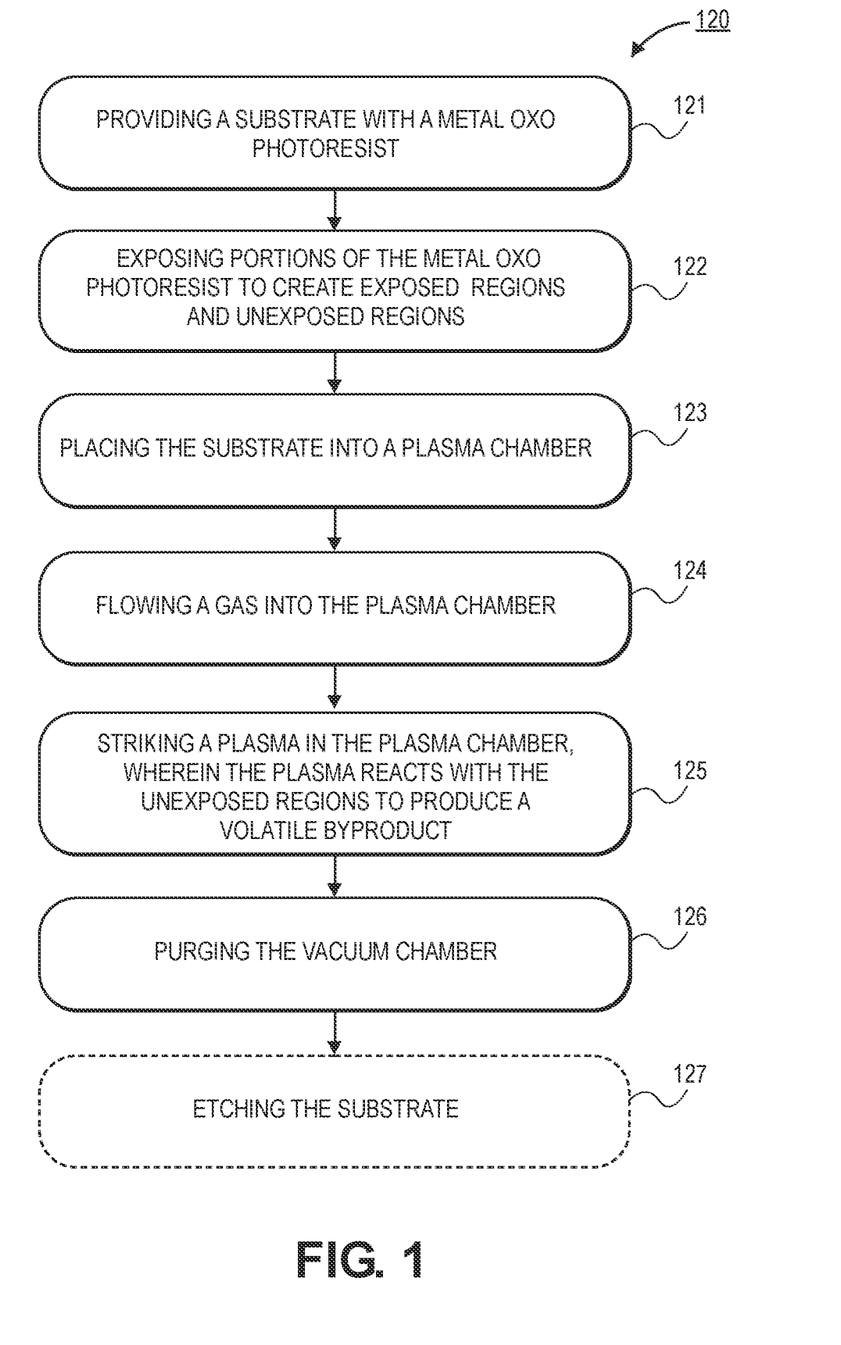
FIG. 1 is a flowchart describing a process for developing a metal oxo photoresist using a plasma process, in accordance with an embodiment of the present disclosure.

Referring now to FIG. 1, a flowchart illustrating a process 120 for developing a metal oxo photoresist on a substrate surface is provided, in accordance with an embodiment of the present disclosure. FIGS. 2A-2D are cross-sectional illustrations of a substrate 261 and a metal oxo photoresist 262 after various operations in process 120.

Figure 2A:
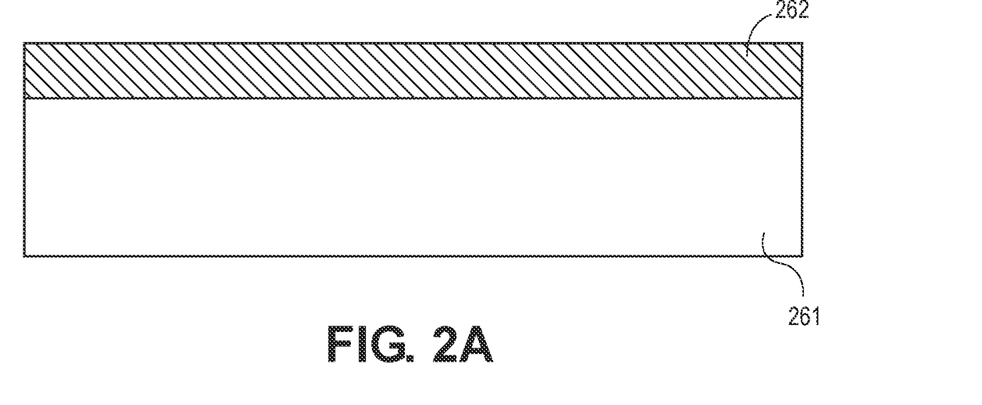
FIGS. 2A-2D are cross-sectional illustrations of a substrate and a photoresist depicting operations in the flowchart of FIG. 1, in accordance with an embodiment of the present disclosure.

In an embodiment, process 120 may begin with operation 121 which comprises providing a substrate with a metal oxo photoresist. FIG. 2A is a cross-sectional illustration of a substrate 261 with a metal oxo photoresist 262 disposed over a surface of the substrate 261. In an embodiment, the substrate 261 may comprise any substrate material or materials typical of semiconductor manufacturing environments. For example, the substrate 261 may comprise a semiconducting material. Substrate 261 may comprise semiconductor devices or portions of semiconductor devices. Examples of such semiconductor devices include, but are not limited to, memory devices or complimentary metal-oxide-semiconductor (CMOS) transistors fabricated in a silicon substrate and encased in a dielectric layer. The substrate 261 may also comprise a plurality of metal interconnects formed above the devices or transistors, and in surrounding dielectric layers, and may be used to electrically couple the devices or transistors to form integrated circuits. In an embodiment, the substrate 261 may be a wafer.

In an embodiment, the metal oxo photoresist 262 (also referred to simply as "photoresist 262"), may be any metal oxo material system. Such material systems typically comprise a metal (e.g., Sn, Hf, Zr, etc.), oxygen, and carbon. In a particular embodiment, the photoresist 262, comprises SnOC. In addition to SnOC, embodiments may comprise a metal oxo material system that further comprises nitrogen and hydrogen.

The photoresist 262 may be disposed over the surface of the substrate 261 using any suitable deposition process. In an embodiment, the photoresist is disposed on the surface of the substrate 261 with a wet chemistry using a spin-on process. In an alternative embodiment, the photoresist is disposed on the surface of the substrate 261 using a vapor phase process (i.e., a dry process). In a vapor phase process, a metal precursor and an oxidant may be vaporized to a vacuum chamber, with the metal precursor and the oxidant reacting to deposit a metal oxo photoresist 262 on the surface of the substrate 261. Such dry processes may be characterized as a chemical vapor deposition (CVD) process, an atomic layer deposition (ALD) process, a plasma enhanced CVD (PE-CVD) process, or a plasma enhanced ALD (PE-ALD) process.

Figure 2B:
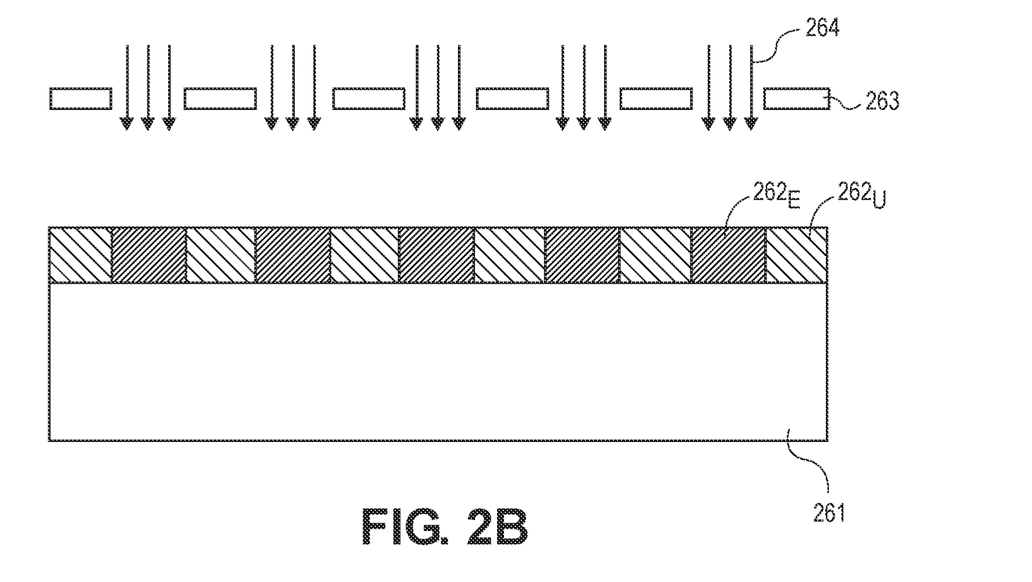

In an embodiment, process 120 may continue with operation 122 which comprises exposing portions of the metal oxo photoresist to create exposed regions and unexposed regions. FIG. 2B is a cross-sectional illustration depicting the exposure process. As shown, electromagnetic radiation 264 passes through a mask 263 to expose the exposed regions $262_E$. The unexposed regions $262_U$ are blocked from the electromagnetic radiation by the mask 263. In an embodiment, the electromagnetic radiation is EUV radiation. When EUV radiation is used, the EUV radiation 264 may be reflected off the mask instead of passing through the mask. While EUV radiation is specifically disclosed herein, it is to be appreciated that any suitable wavelength of electromagnetic radiation that can initiate a solubility switch in the metal oxo photoresist 262 may be used. For example, DUV radiation may be used in some embodiments.

In an embodiment, the solubility switch is provided by the loss of carbon and cross-linking of the metal oxo network in the exposed regions. Particularly, the exposure to electromagnetic radiation results in the removal of carbon from the exposed regions $262_E$. The higher the carbon content and more of the weaker bonds in the unexposed regions $262_U$ renders the unexposed regions more susceptible to patterning in the subsequent non-wet development process.

In an embodiment, process 120 may continue with operation 123 which comprises placing the substrate into a plasma chamber. In an embodiment, the plasma chamber may be any suitable chamber for striking a plasma in sub-atmospheric pressure conditions. The plasma chamber may also include heating/cooling features to provide thermal control of the plasma process. For example, a chuck on which the substrate 261 is placed may be an actively heated and/or cooled chuck. Additionally, walls of the plasma chamber may be actively heated and/or cooled in some embodiments. A more detailed description of a suitable plasma chamber is provided below with respect to FIG. 7.

Figure 2C:
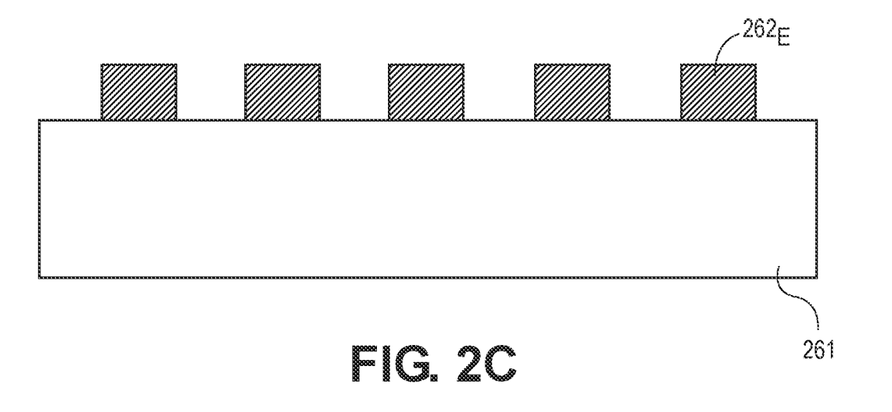

In an embodiment, process 120 may continue with operations 124 and 125 which comprise flowing a gas into the plasma chamber and striking a plasma in the plasma chamber. In an embodiment, the gas comprises a reactive gas and an inert gas. The reactive gas may comprise one or more of $Cl_2$, $Br_2$ HBr. HCl, $H_2$, $BCl_3$, $CH_xCl_y$, $CH_4$, $BBr_3$, and $CH_xBr_y$. In an embodiment, the inert gas may comprise Ar, $N_2$, or He. In a particular embodiment, the reactive gas comprises HBr and the inert gas comprises Ar. In an embodiment, the plasma formed by the reactive gas reacts with the unexposed regions of the metal oxo photoresist $262_U$ to form a volatile byproduct. For example, metal M (e.g., Sn) and Cl will react to form volatile $MCl_4$. An example of a developed photoresist after conversion of the unexposed regions $262_U$ into a volatile byproduct is shown in FIG. 2C. It is to be appreciated that striking a plasma is optional. That is, in some embodiments, a non-wet process may comprise flowing the reactive gas into the chamber without striking a plasma. Such a process may be considered a thermal process as opposed to a plasma process. In such instances, the reactive gas may directly react with the unexposed regions of the metal oxo photoresist $262_U$ without the need for ionizing the reactive gas.

In an embodiment, a ratio of a flowrate of the inert gas to a flowrate of the reactive gas is between 0:1 and 50:1. For example, a flowrate of the inert gas may be 300 sccm and a flowrate of the reactive gas may be 50 sccm. A dilute chemistry slows the etch rate and improves etching uniformity. Uniformity is improved because the inert gas helps to uniformly distribute the reactive gas throughout the plasma chamber. Additionally, it has been generally shown that increases in the flowrate of the reactive gas provides an increase in the etching of the unexposed regions $262_U$ relative to the exposed regions $262_E$. In an embodiment, the pressure may be between approximately 1 mtorr and approximately 100 mtorr. In a particular embodiment, the pressure may be between approximately 5 mtorr and approximately 20 mtorr. In yet another embodiment, the pressure may be between approximately 1 mtorr and approximately 10 torr.

In an embodiment, the substrate 261 may have a controlled temperature during operations 124 and 125. For example, the temperature may vary between approximately 0° C. and approximately 500° C. In a particular embodiment, the temperature may vary between approximately 50° C. and approximately 150° C. Generally, lower temperatures (e.g., less than 500° C.) are beneficial since the metal oxo photoresist does not thermally decompose at the lower temperatures. In yet another embodiment, the temperature may be less than approximately 200° C. For example, the temperature may be between approximately 40° C. and approximately 100° C.

In an embodiment, RF power of the plasma etching process may be controlled. Generally, a lower RF power may result in improved etch selectivity. In an embodiment, the source power may be between approximately 200 W and approximately 1200 W. In a particular embodiment, the source power may be approximately 400 W. In an embodiment, the bias power may be between approximately 0 W and approximately 200 W. In a particular embodiment, the bias power may be approximately 50 W. It has been shown that increases of the bias power up to approximately 100 W provides enhanced etching selectivity of the unexposed regions $262_U$ relative to the exposed regions $262_E$.

In an embodiment, operation 125 may be implemented with a pulsed bias. The duty cycle of the pulsing may be between 0% and 100%. In a particular embodiment, the duty cycle is approximately 50%. Such a duty cycle allows time for byproduct removal and provides less ion bombardment. Accordingly, etch selectivity of the unexposed regions $262_U$ relative to the exposed regions $262_E$ is improved.

In an embodiment, operation 125 may be implemented for any desired duration of time. Longer periods of time allow for more of the unexposed regions $262_U$ to be removed. In an embodiment, operation 125 may have a duration between approximately 5 seconds and approximately 120 seconds. In a particular embodiment, operations 125 may have a duration of approximately 15 seconds.

By varying various parameters of the plasma development process, such as those described above, a high etch selectivity of the unexposed regions of the metal oxo photoresist $262_U$ to the exposed regions of the metal oxo photoresist $262_E$ is provided. For example, the etch selectivity may be approximately 10:1 or greater. In a particular embodiment, the etch selectivity may be approximately 12:1. A high etch selectivity provides several benefits. One such benefit is that the thickness of the photoresist may be reduced. This allows for lower doses of electromagnetic radiation to be used in order to fully develop the photoresist.

In an embodiment process 120 may continue with operation 126 which comprises purging the plasma chamber. Purging the plasma chamber removes the byproducts from the reaction in operation 125 from the plasma chamber. In an embodiment, a single purge may be implemented after the completion of the etching in operation 125. In alternative embodiments, operations 124/125 and 126 may define a cycle comprising a pulse of the etching followed by a purge. In such embodiments, a plurality of cycles may be repeated in order to clear the unexposed regions of the photoresist $262_U$.

Embodiments disclosed herein provide the additional benefit of being implemented in a plasma chamber. This is especially beneficial when the subsequent patterning of the substrate 261 is executed using a plasma etch. Particularly, the substrate 261 does not need to be removed from the plasma chamber following the photoresist developing process. That is, an all-in-one (i.e., all-in-one chamber) solution for pattern development and pattern transfer into the underlayer is provided.

Figure 2D:
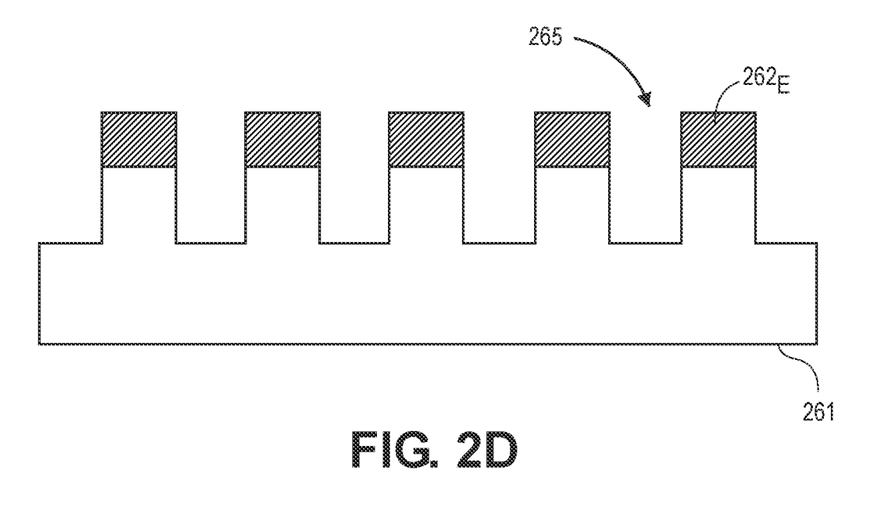

In an embodiment, process 120 may continue with optional operation 127 which comprises etching the substrate 261. FIG. 2D is a cross-sectional illustration of the substrate 261 after the pattern of the exposed regions of the metal oxo photoresist $262_E$ is transferred into the substrate 261. As shown, the pattern transfer may result in the formation of trenches 265 into the substrate 261. In an embodiment, the etching of the substrate 261 may be implemented using a plasma etching process. The plasma etching process may be executed in the same chamber that is used to develop the metal oxo photoresist.

Figure 3:
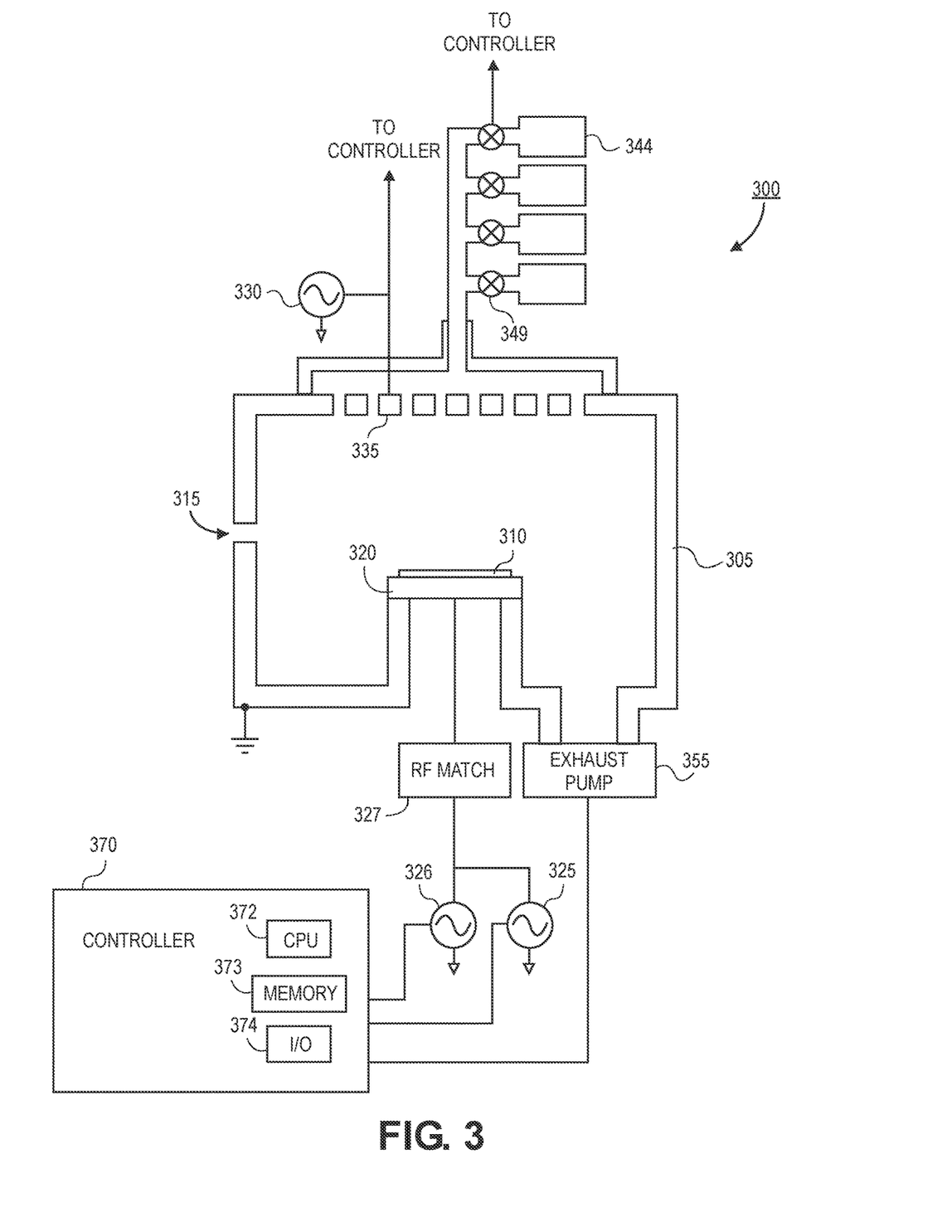
FIG. 3 is a cross-sectional illustration of a processing tool that may be used to implement portions of the process in FIG. 1, in accordance with an embodiment of the present disclosure.

FIG. 3 is a schematic of a plasma chamber configured to perform a plasma based development of a metal oxo photoresist, in accordance with an embodiment of the present disclosure. Plasma chamber 300 includes a grounded chamber 305. A substrate 310 is loaded through an opening 315 and clamped to a temperature controlled chuck 320.

Process gases, are supplied from gas sources 344 through respective mass flow controllers 349 to the interior of the chamber 305. In certain embodiments, a gas distribution plate 335 provides for distribution of process gases 344, such as $Cl_2$, $Br_2$, $H_2$, HCl, HBr, and/or an inert gas. Chamber 305 is evacuated via an exhaust pump 355.

When RF power is applied during processing of a substrate 310, a plasma is formed in chamber processing region over substrate 310. Bias power RF generator 325 is coupled to the temperature controlled chuck 320. Bias power RF generator 325 provides bias power, if desired, to energize the plasma. Bias power RF generator 325 may have a low frequency between about 2 MHz to 60 MHz for example, and in a particular embodiment, is in the 13.56 MHz band. In certain embodiments, the plasma chamber 300 includes a third bias power RF generator 326 at a frequency at about the 2 MHz band which is connected to the same RF match 327 as bias power RF generator 325. Source power RF generator 330 is coupled through a match (not depicted) to a plasma generating element (e.g., gas distribution plate 335) to provide a source power to energize the plasma. Source RF generator 330 may have a frequency between 100 and 180 MHz, for example, and in a particular embodiment, is in the 162 MHz band. Because substrate diameters have progressed over time, from 150 mm, 200 mm, 300 mm, etc., it is common in the art to normalize the source and bias power of a plasma etch system to the substrate area.

The plasma chamber 300 is controlled by controller 370. The controller 370 may comprise a CPU 372, a memory 373, and an I/O interface 374. The CPU 372 may execute processing operations within the plasma chamber 300 in accordance with instructions stored in the memory 373. For example, one or more processes such as portions of process 120 described above may be executed in the plasma chamber by the controller 370.

Figure 4:
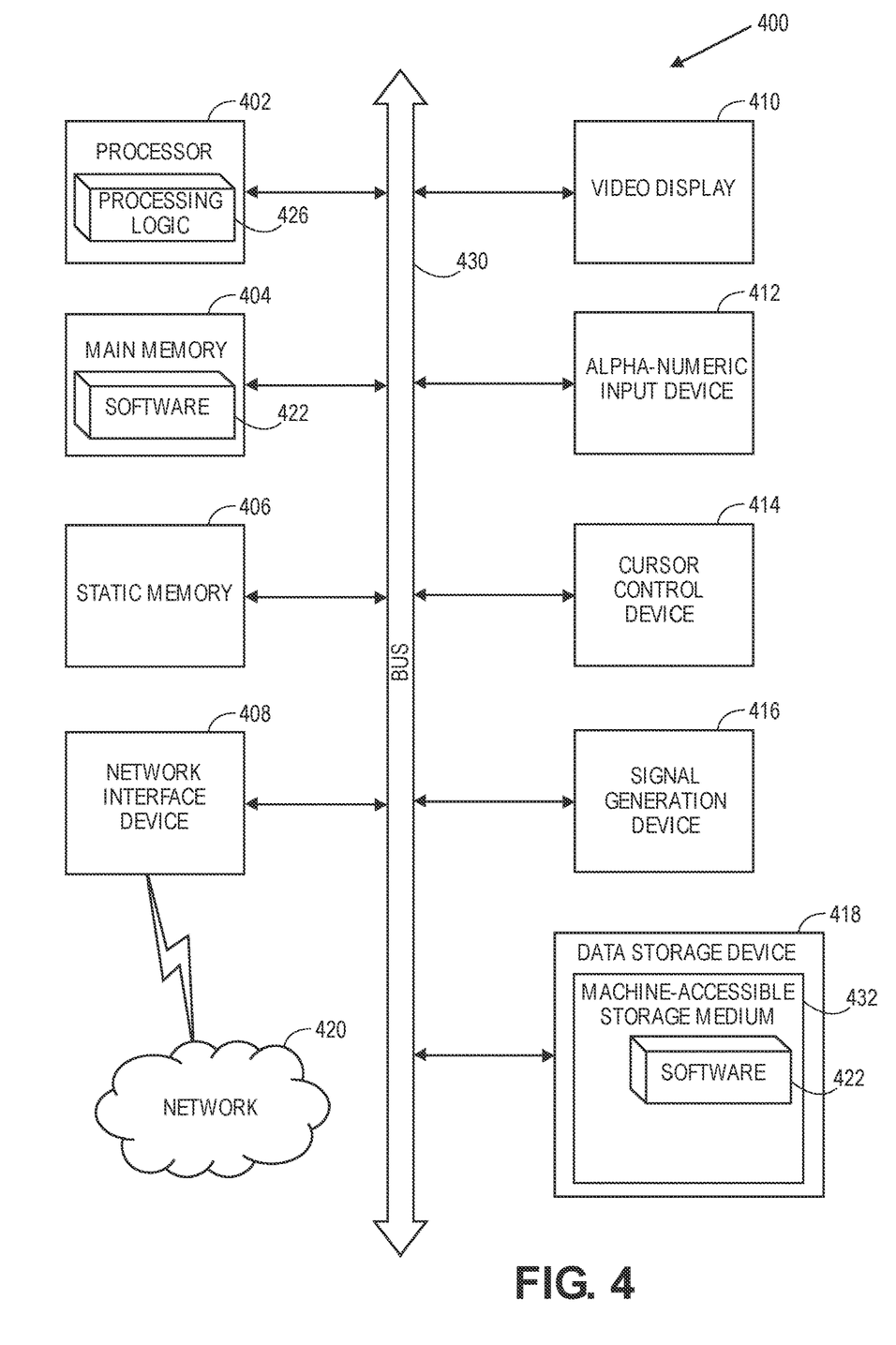
FIG. 4 illustrates a block diagram of an exemplary computer system, in accordance with an embodiment of the present disclosure.

FIG. 4 illustrates a diagrammatic representation of a machine in the exemplary form of a computer system 400 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 400 includes a processor 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), MRAM, etc.), and a secondary memory 418 (e.g., a data storage device), which communicate with each other via a bus 430.

Processor 402 represents one or more general-purpose processing devices such as a microprocessor, central processing unit, or the like. More particularly, the processor 402 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 402 may also be one or more special-purpose processing devices such as an application specific integrated circuit (ASIC), a field programmable gate array (FPGA), a digital signal processor (DSP), network processor, or the like. Processor 402 is configured to execute the processing logic 426 for performing the operations described herein.

The computer system 400 may further include a network interface device 408. The computer system 400 also may include a video display unit 410 (e.g., a liquid crystal display (LCD), a light emitting diode display (LED), or a cathode ray tube (CRT)), an alphanumeric input device 412 (e.g., a keyboard), a cursor control device 414 (e.g., a mouse), and a signal generation device 416 (e.g., a speaker).

The secondary memory 418 may include a machine-accessible storage medium (or more specifically a computer-readable storage medium) 432 on which is stored one or more sets of instructions (e.g., software 422) embodying any one or more of the methodologies or functions described herein. The software 422 may also reside, completely or at least partially, within the main memory 404 and/or within the processor 402 during execution thereof by the computer system 400, the main memory 404 and the processor 402 also constituting machine-readable storage media. The software 422 may further be transmitted or received over a network 420 via the network interface device 408.

While the machine-accessible storage medium 432 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of developing a metal oxo photoresist on a substrate with plasma processes. The method includes exposing a metal oxo photoresist to provide exposed and unexposed regions, and placing a substrate with the exposed photoresist into a plasma chamber. In an embodiment, a gas is flown into the plasma chamber and a plasma is struck. The gas may comprise a reactive gas and an inert gas. In an embodiment, the plasma reacts with the unexposed regions of the photoresist to convert the unexposed regions of the photoresist into a volatile byproduct that can be purged from the plasma chamber. For example, the reactive gas may comprise one or more of a $Cl_2$, $Br_2$, HBr, HCl, and $H_2$.

Thus, methods for forming a developing a metal oxo photoresist using plasma processes have been disclosed.

What is claimed is:

1. A method of developing a metal oxo photoresist, comprising:
   providing a substrate with the metal oxo photoresist into a chamber, wherein the metal oxo photoresist comprises exposed regions and unexposed regions, the exposed regions comprising a first non-zero carbon concentration, and the unexposed regions comprising a second non-zero carbon concentration, and wherein the second non-zero carbon concentration of the unexposed regions is higher than the first non-zero carbon concentration of the exposed regions;
   flowing a gas into the chamber for a duration between 5 seconds and 120 seconds, wherein the gas reacts with the unexposed regions with a selectivity greater than 10:1 compared to the exposed regions to produce a volatile byproduct, and wherein the gas comprises a reactive gas comprising one or more of $Br_2$ or HCl, the gas has a pressure between 5 mTorr and 20 mTorr in the chamber, the substrate has a temperature between 40° C. and 100° C., wherein the chamber is powered by a source of between 200 W and 1200 W, and a power bias between 0 W and 200 W; and
   etching the substrate before removing the substrate from the chamber.

2. The method of claim 1, further comprising:
   striking a plasma in the chamber.

3. The method of claim 1, wherein the gas further comprises an inert gas.

4. The method of claim 3, wherein a ratio of a flowrate of the inert gas to a flowrate of the reactive gas is between 0:1 and 50:1.

5. The method of claim 1, wherein reacting the gas with the unexposed regions is implemented with a thermal process without a plasma.

6. The method of claim 1, wherein the power bias is pulsed, wherein the pulsing has a duty cycle between 0% and 100%.

7. The method of claim 1, wherein the metal oxo photoresist comprises SnOC.

8. The method of claim 1, wherein the exposed regions comprise a cross-linked metal oxide network, and wherein the unexposed regions comprise a metal oxide cluster.

9. A method of developing a metal oxo photoresist, comprising:
   providing a substrate with the metal oxo photoresist on a surface of the substrate;
   exposing the metal oxo photoresist to form exposed regions and unexposed regions, the exposed regions comprising a first non-zero carbon concentration, and the unexposed regions comprising a second non-zero carbon concentration, wherein the second non-zero carbon concentration of the unexposed regions is higher than the first non-zero carbon concentration of the exposed regions;
   placing the substrate in a plasma chamber;
   flowing a gas into the plasma chamber for a duration between 5 seconds and 120 seconds, wherein the gas reacts with the unexposed regions with a selectivity greater than 10:1 compared to the exposed regions to produce a volatile byproduct, and wherein the gas comprises a reactive gas comprising one or more of $Br_2$ or HCl, the gas has a pressure between 5 mTorr and 20 mTorr in the chamber, the substrate has a temperature between 40° C. and 100° C., wherein the chamber is powered by a source of between 200 W and 1200 W, and a power bias between 0 W and 200 W;
   striking a plasma in the plasma chamber, wherein the plasma reacts with the unexposed regions to produce a volatile byproduct;
   purging the plasma chamber; and
   etching the substrate before removing the substrate from the plasma chamber.

10. The method of claim 9, wherein the gas further comprises an inert gas.

11. The method of claim 10, wherein a ratio of a flowrate of the inert gas to a flowrate of the reactive gas is between 0:1 and 50:1.

12. The method of claim 9, wherein the metal oxo photoresist comprises SnOC.

13. The method of claim 9, wherein exposing the metal oxo photoresist comprises exposing the metal oxo photoresist to extreme ultraviolet (EUV) radiation.

14. The method of claim 1, wherein the reactive gas is $Br_2$.

15. The method of claim 1, wherein the reactive gas is HCl.

16. The method of claim 9, wherein the reactive gas is $Br_2$.

17. The method of claim 9, wherein the reactive gas is HCl.

* * * * *